US007538150B2

(12) United States Patent
Oohori et al.

(10) Patent No.: US 7,538,150 B2
(45) Date of Patent: May 26, 2009

(54) DIHYDROBENZOXAZINE RING-CONTAINING RESIN, PHENOLIC-TRIAZINE-ALDEHYDE CONDENSATE AND EPOXY RESIN

(75) Inventors: Kenichi Oohori, Shimodate (JP); Yoshihiro Nakamura, Shimodate (JP); Hikari Murai, Yuki (JP); Yoshiyuki Takeda, Shimodate (JP); Yasuyuki Hirai, Oyama (JP); Shinichi Kamoshida, Shimodate (JP); Minoru Kakitani, Shimodate (JP); Norihiro Abe, Shimodate (JP); Syunichi Numata, Hitachi (JP); Teruki Aizawa, Utsunomiya (JP); Ken Nanaumi, Shimodate (JP)

(73) Assignee: Hitachi Chemical Company, Ltd, Tokyo (JP)

( * ) Notice: Subject to any disclaimer, the term of this patent is extended or adjusted under 35 U.S.C. 154(b) by 337 days.

(21) Appl. No.: 11/219,821

(22) Filed: Sep. 7, 2005

(65) Prior Publication Data
US 2006/0008632 A1     Jan. 12, 2006

Related U.S. Application Data

(63) Continuation of application No. 10/250,770, filed as application No. PCT/JP02/00063 on Jan. 10, 2002, now abandoned.

(30) Foreign Application Priority Data
Jan. 10, 2001 (JP) ................................ 2001-2763

(51) Int. Cl.
*B32B 15/08* (2006.01)
*B32B 27/04* (2006.01)
*B32B 27/28* (2006.01)
*C08K 5/521* (2006.01)
*C08L 61/08* (2006.01)
*C08L 63/02* (2006.01)
*H05K 1/05* (2006.01)

(52) U.S. Cl. ...................... 523/429; 174/259; 428/175; 428/297.4; 428/418; 523/506; 525/486

(58) Field of Classification Search ....................... None
See application file for complete search history.

(56) References Cited

U.S. PATENT DOCUMENTS 6,063,839 A * 5/2000 Oosedo et al. ............... 523/206
6,207,786 B1 3/2001 Ishida et al.

FOREIGN PATENT DOCUMENTS

| JP | 7-330928 | | 12/1995 |
| JP | 10-244623 | | 9/1998 |
| JP | 11-060898 | A | 3/1999 |
| JP | 11-60898 | A * | 3/1999 |
| JP | 11-158352 | A * | 6/1999 |
| JP | 11-228786 | A * | 8/1999 |
| JP | 2000-007901 | A | 1/2000 |
| JP | 2001-7901 | A * | 1/2001 |
| JP | 2001-106869 | | 4/2001 |
| JP | 2001-106869 | A * | 4/2001 |
| JP | 2001-131393 | | 5/2001 |
| JP | 2001-131393 | A * | 5/2001 |

OTHER PUBLICATIONS

Chemical abstracts registry No. 221052-45-5 for LA-7054, melamine-modified phenol novolak, 1967, one page.*
Chemical abstracts registry No. 442847-25-8 for LA-1356, copolymer of an aldehyde and compound containing phenol and triazine rings, 1967, one page.*
Chemical abstracts registry No. 139189-30-3 for PX-200, resorcinol bis(di-2,6-xylyl phosphate, 1967, one page.*
International Search Report dated Apr. 9, 2002 for PCT/JP02/00063.
Notice of Reasons for Rejection (Official Action) for Application No. JP2002-556662, dated Feb. 19, 2008.

* cited by examiner

*Primary Examiner*—Robert Sellers
(74) *Attorney, Agent, or Firm*—Antonelli, Terry, Stout & Kraus, LLP.

(57) ABSTRACT

The present invention discloses a thermosetting resin composition which comprises (A) 35 to 75 parts by weight of a thermosetting resin comprising a compound having a hydrobenzoxazine ring as a main component, (B) 10 to 25 parts by weight of a polycondensation product of a phenol, a compound having a triazine ring and an aldehyde, and (C) 10 to 45 parts by weight of an epoxy resin, based on 100 parts by weight of the total amount of organic solid components of Components (A), (B) and (C), and (i) a bisphenol F epoxy resin having a weight-average molecular weight of 1,000 to 3,000, or (ii) a mixed epoxy resin of bisphenol F epoxy resin and bisphenol A epoxy resin having a weight average molecular weight of 1,000 to 3,000, is contained in Component (C) in an amount of 0 to 100% by weight of Component (C); and a prepreg, a laminated board for a wiring board and a wiring board using the same.

26 Claims, No Drawings

DIHYDROBENZOXAZINE RING-CONTAINING RESIN, PHENOLIC-TRIAZINE-ALDEHYDE CONDENSATE AND EPOXY RESIN This application is a Continuation application of application Ser. No. 10/250,770, filed Jul. 9, 2003, now abandoned the contents of which are incorporated herein by reference in their entirety. Ser. No. 10/250,770 is a National Stage application, filed under 35 USC 371, of International (PCT) Application No. PCT/JP02/00063, filed Jan. 10, 2002.

TECHNICAL FIELD

The present invention relates to a thermosetting resin composition and its uses such as a prepreg, a laminated board for a printed wiring board, a printed wiring board, a molding material and a composition for adhesive, and particularly, to a thermosetting resin composition suitable for a high-frequency circuit board of the MHz band or higher that takes advantage of low dielectric dissipation factor, and for impregnation of a glass substrate for a built-up type base board that takes advantage of high modulus of elasticity.

BACKGROUND ART

In recent years, electronic equipments have generally been required to offer lighter weight and more compact size. In accommodation of this, although the printed wiring boards used inside these equipments predominantly consist of 4-10 layers, in order to accommodate high-density mounting, efforts are being made to increase pattern fineness, and further to reduce mounting height and employ a built-up constitution.

Printed wiring boards are required to have low dielectric dissipation factor as well as be stable over a wide temperature range and wide frequency band in order to inhibit transmission loss when used in high-frequency circuits and ensure stable operation of the circuit in their temperature range and frequency bands. In addition, since materials having large dimensional expansion and contraction rates are frequently used for the surface built-up layer in built-up boards enabling low mounting height and high density mounting, they are susceptible to the occurrence of considerable warping due to contraction during curing and cooling of the surface built-up layer. Consequently, the printed wiring boards and multi-layer wiring boards on both sides of the inside core layer are required to be thin and have high rigidity. In addition, accompanying the use of a lead-free material for a solder, the melting point of the solder is expected to be higher, thereby resulting in the need for higher moisture absorption-heat resistance and reliability.

Thus, the materials for printed wiring boards are required to adequately possess all of the characteristics of low dielectric dissipation factor, high modulus of elasticity, high heat resistance, low moisture absorption and high glass transition point (Tg).

In addition, these materials are also required to be flame retardant in consideration of safety. Consequently, attempts have been made to ensure flame retardancy by combining the use of halogen-based flame retardants, antimony compounds or phosphorous-based flame retardants. In recent years, however, there has been a growing trend towards controls on substances used in consideration of environmental pollution and toxicity, and the toxicity and carcinogenicity of organic halogen substances such as dioxin in particular have become a problem. Consequently, there is a strong need to reduce or eliminate halogen-containing substances, and according to JPCA standards, halogen-free materials are defined as having individual contents of halogen elements being 0.09% by weight or less. In order to satisfy this standard value, it is necessary to suppress the content of each halogen element in the resin used to 0.25% by weight or less even in the case in which the halogen content in the resin is at the highest allowed level for the lowest amount of the resin used and the minimum resin weight being about 38% of the total weight of the prepreg.

In order to satisfy the above requirements, materials in which an epoxy resin, a polyimide resin or an isocyanate resin is improved or modified have been researched. Among these, resins having a dihydrobenzoxazine ring have superior characteristics such as low dielectric dissipation factor, high modulus of elasticity, high heat resistance, low moisture absorption, high Tg and high flame retardancy, so that they have been attempted to use in a substrate for wiring boards and so forth. However, since resins having a benzoxazine ring have a rigid skeleton, they do not exhibit toughness. Consequently, they are susceptible to the occurrence of inner layer separation during blank die processing, and have poor discharge of cuttings during small diameter drilling, resulting in the problem of susceptibility to occurrence of breakage of the drill bit. In order to solve such problems, it is necessary to blend epoxy resin into the resin composition at 40 parts by weight or more based on 100 parts by weight of the organic solid components as disclosed in Japanese Patent Laid-Open Publication No. 11-158352. However, when such epoxy resin is formulated in relatively large amounts, problems occur including loss of the inherent characteristics of low dielectric dissipation factor, high modulus of elasticity, high heat resistance, low moisture absorption, high Tg and superior processability, while also preventing the attainment of V-0 flame retardancy as specified in standard UL94 pertaining to flame retardancy in thin materials.

Consequently, a printed wiring board material is required that has low dielectric dissipation factor, high modulus of elasticity, high heat resistance, low moisture absorption, high Tg as well as a halogen and antimony compound content in a thermosetting resin composition of 0.25% by weight or less, and flame retardancy of V-0 in standard UL94.

SUMMARY OF THE INVENTION

An object of the present invention is to solve the above-mentioned problems and to provide a thermosetting resin composition in which the halogen and antimony compound content is 0.25% by weight or less and which has a proper balance between processability and characteristics such as low dissipation factor, high modulus of elasticity, high heat resistance, low moisture absorption, high Tg and flame retardancy, along with a prepreg, laminated board for a wiring board, printed wiring board, molding material and adhesive composition in which it is used.

The present invention relates to a thermosetting resin composition which comprises:
(A) 35 to 75 parts by weight of a thermosetting resin comprising a compound having a dihydrobenzoxazine ring as a main component;
(B) 10 to 25 parts by weight of a polycondensation product of a phenol, a compound having a triazine ring and an aldehyde; and
(C) 10 to 45 parts by weight of an epoxy resin, based on 100 parts by weight of the total amount of the organic solid components of Components (A), (B) and (C); and (i) a bisphenol F type epoxy resin having a weight average molecular weight of 1,000 to 3,000, or
(ii) a mixed epoxy resin of bisphenol F type epoxy resin and bisphenol A type epoxy resin having a weight average molecular weight of 1,000 to 3,000, is contained in Component (C) in an amount of 0 to 100% by weight, e.g., 4 to 100% by weight, of Component (C).

BEST MODE FOR CARRYING OUT THE INVENTION

Component (A) of the present invention is not specifically limited, namely a thermosetting resin having for its main component a compound having a dihydrobenzoxazine ring, provided it is a resin that is cured by a ring-opening reaction of the dihydrobenzoxazine ring. In consideration of both of characteristics such as low dielectric dissipation factor, high modulus of elasticity, high heat resistance, low moisture absorption, high Tg and high flame retardancy, and die processability, Component (A) is contained in the composition of the present invention in an amount of 35 to 75 parts by weight, preferably 40 to 70 parts by weight based on 100 parts by weight of the total amount of the organic solid components of Components (A), (B) and (C).

Moreover, making the softening point of the thermosetting resin comprising a compound having a dihydrobenzoxazine ring as a main component 110° C. or lower decreases the shortcoming of the skeleton being rigid and lacking toughness, and is effective in reducing inner layer separation during blank die punching as well as improving peel strength of the inner layer that exhibits adhesive strength with the resin layer in contact with the inner layer circuit of multi-layer wiring boards.

According to the present invention, Component (A) can be produced from a compound having a phenolic hydroxyl group, a primary amine and formaldehyde as represented by the following formula:

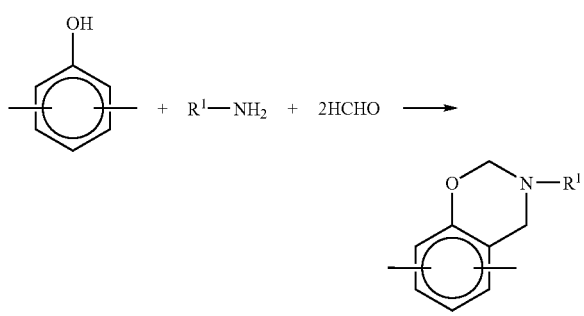

wherein $R^1$ represents an alkyl group, a cycloalkyl group such as a cyclohexyl group, etc., or an aromatic group such as a phenyl group or a phenyl group which may be substituted by an alkyl group or an alkoxy group.

As the above-mentioned compound having a phenolic hydroxyl group, there may be mentioned polyfunctional phenols, biphenol compounds, bisphenol compounds, trisphenol compounds, tetraphenol compounds and phenol resins. Examples of the polyfunctional phenols include catechol, hydroquinone and resorcinol. Examples of the bisphenol compounds include bisphenol A, bisphenol F and its positional isomers, bisphenol S and tetrafluorobisphenol A. In addition, examples of the phenol resins may include resol resin, phenol novolak resin, phenol-modified xylene resin, alkylphenol resin, melamine phenol resin, benzoguanamine phenol resin and phenol-modified polybutadiene.

In addition, formaldehyde can be used in the form of formalin, paraformaldehyde and so on. Moreover, examples of the primary amines may include methylamine, cyclohexylamine, aniline and substituted aniline.

According to the present invention, it can be synthesized by adding a mixture of a compound having a phenolic hydroxyl group and a primary amine to formaldehyde heated to 70° C. or higher, reaching at 70 to 110° C., preferably at 90 to 100° C. for 20 to 120 minutes, and then drying under reduced pressure at a temperature of 120° C. or lower.

Examples of phenols used to obtain Component (B) of the present invention, namely the polycondensation product of a phenol, a compound having a triazine ring and an aldehyde, may include phenol, polyvalent phenols such as bisphenol A, bisphenol F or bisphenol S, alkylphenols such as cresol, xylenol, ethylphenol or butylphenol, aminophenols and phenylphenols, and one kind or two or more kinds can be used in combination. In the case of using a combination of phenol and bisphenol A or a combination of phenol and alkylphenol, it is preferable due to superior moldability resulting from reactivity being inhibited to a greater extent than in the case of using phenol alone, and is also preferable due to superior flame retardancy as compared with using bisphenol A or alkylphenol alone.

In addition, examples of the compounds having a triazine ring may include melamine or guanamine derivatives such as benzoguanamine and acetoguanamine, cyanuric acid or cyanuric acid derivatives such as methylcyanurate and ethylcyanurate, and isocyanuric acid or isocyanuric acid derivatives such as methylisocyanurate and ethylisocyanurate. Melamine is suitable due to its satisfactory heat resistance and flame retardancy as well as its low price, and the type and amount used of the compound having a triazine ring can be selected according to the purpose, and flame retardancy, reactivity and heat resistance can be optimized by adjusting the N content.

Examples of the aldehydes may include formaldehyde, paraformaldehyde, trioxane and tetraoxymethylene. Although the aldehyde is not limited to these, in terms of ease of handling, formaldehyde is preferable, and formalin or paraformaldehyde is particularly preferable.

The synthesis method of the modified phenol resin used in the present invention comprises reacting the major materials of the above phenols, compound having a triazine ring and aldehydes in the presence of a catalyst by blending at a desired N (nitrogen) content and a hydroxyl group equivalent. As the catalyst at this time, basic catalysts are preferable due to the satisfactory solubility of the compound having a triazine ring. In particular, amines are preferable since metals and so forth are not preferable as electrical insulating materials if they remain in the form of catalyst residue. The order of the reaction is not specifically limited, and all major materials can be reacted simultaneously or two types of major materials can be reacted selectively in advance. Reaction is preferably carried out in the presence of various kinds of solvents such as acetone and methyl ethyl ketone since it enables stable control of the reaction. The modified phenol resin used in the present invention can be obtained by removing unreacted phenols, aldehydes and solvent by neutralization, washing, heat treatment or distillation, etc. the reaction product in accordance with the conventional manner.

In the above reaction, a molar ratio of the aldehyde to the phenol is not particularly limited, and it is preferably 0.2 to 1.5, more preferably 0.4 to 0.8. In addition, a weight ratio of the compound having a triazine ring to the phenol is preferably 10 to 98:90 to 2, and more preferably 50 to 95:50 to 5, in consideration of both of resinification and flame retardant effects.

Moreover, by combining several kinds of the modified phenol resins of the present invention or by using as a curing agent in combination with novolak resins as other phenols, moldability, flame retardancy and heat resistance can be obtained that cannot be obtained when using the modified phenol resin alone, and using in combination according to the purpose is also preferable.

In addition, in consideration of the ratio and heat curing reactivity in the reaction of individual components, Component (B) is contained in the composition of the present invention in an amount of 10 to 25 parts by weight, preferably 15 to 20 parts by weight based on 100 parts by weight of the total amount of the organic solid components of Components (A), (B) and (C).

Examples of the epoxy resin of Component (C) of the present invention may include bisphenol A type epoxy resin, bisphenol F type epoxy resin, phenol novolak type epoxy resin, bisphenol A novolak type epoxy resin, cresol novolak type epoxy resin, cyclic aliphatic epoxy compounds, heterocyclic epoxy compounds and diglycidyl ester type epoxy compounds, although not particularly limited to these. These may be used alone or in combination of two or more kinds.

Moreover, according to one embodiment of the present invention, in the case of not containing (i) bisphenol F type epoxy resin or (ii) an epoxy resin that is a mixture of bisphenol F type epoxy resin and bisphenol A type epoxy resin (hereinafter abbreviated to as a mixed epoxy resin) in the composition of the present invention, in consideration of both of punching processability and dielectric dissipation factor (as well as modulus of elasticity, flame retardancy and Tg), Component (C) is contained in the composition of the present invention in an amount of 10 to 40 parts by weight, preferably 15 to 40 parts by weight based on 100 parts by weight of the total amount of the organic solid components of Components (A), (B) and (C).

According to another embodiment of the present invention, (i) bisphenol F type epoxy resin or (ii) the mixed epoxy resin is contained in Component (C) as a part or all of the same. Here, Components (i) and (ii) have a weight average molecular weight (Mw) of 1,000 to 3,000, preferably 1,500 to 2,500. Examples of Components (i) and (ii) may include R-304PD or R-364 available from Mitsui Chemical Co., Ltd. Component (i) or (ii) is contained in Component (C) in an amount of 0 to 100% by weight, preferably 4 to 60% by weight, of Component (C). In other words, a part or all of Component (C) uses Component (i) or (ii) in an amount of 2 to 30 parts by weight, preferably 2 to 25 parts by weight based on 100 parts by weight of the total amount of the organic solid components of Components (A), (B) and (C) (here, the amount of bisphenol F type epoxy resin or the mixed epoxy resin does not exceed the amount of Component (C) as a matter of course). Incidentally, in the case of using Component (i) or (ii) for a part or all of Component (C), Component (C) is used in an amount of 10 to 45 parts by weight, preferably 30 to 45 parts by weight based on 100 parts by weight of the total amount of the organic solid components of Components (A), (B) and (C). Since Component (i) or (ii) has superior flame retardancy in comparison with the bisphenol A type epoxy resin, it can be added in the above amount without impairing the object of the present invention.

An inorganic filler as Component (D) can also be contained in the composition of the present invention. As Component (D), the inorganic filler, known materials can be used without any specific limitation, and can be selected according to the purpose of use. Examples thereof may include inorganic hydrates such as aluminum hydroxide, magnesium hydroxide, zeolite and hydrotalcite; typically used inorganic fillers such as clay, talc, wallastonite, mica, calcium carbonate, magnesium carbonate, alumina, silica and glass powder; B- or Sn-based fillers such as zinc borate, zinc stannate and zinc hydroxystannate; metal oxides such as zinc oxide and tin oxide; inorganic phosphorous materials such as red phosphorous; and nitrates such as those of copper and zinc. In addition, the inorganic filler is preferably coated or surface treated with a silane coupling agent, a titanate coupling agent or zinc molybdenate and so forth to improve adhesion with organic components, heat resistance, as well as stability with respect to temperature and humidity, and safeness.

Component (b), the inorganic filler is preferably contained in an amount of 5 to 300 parts by weight, more preferably 10 to 260 parts by weight, even more preferably 20 to 250 parts by weight, and particularly preferably 30 to 100 parts by weight based on 100 parts by weight of the total amount of the organic solid components of Components (A), (B) and (C).

In addition, in order to achieve the target flame retardancy by using only a halogen-free material, the limit on the content of the triazine ring in the thermosetting resin composition of the present invention, namely the N content that is effective for enhancing flame retardancy, is up to 5% by weight or so in the organic resin solid components, and it is not possible to attain flame retardancy of V-1 or V-0 in the standard UL94 unless either a special epoxy resin is used while ignoring other characteristics and moldability or significantly increasing the amount of the phenol resin composition. Consequently, in order to attain flame retardancy of V-1 or V-0 of the standard UL94, it is necessary to have an additive assistant effect in flame retardancy. In order to achieve this, it is preferable to add 5 parts or more of inorganic filler to decrease the percentage of flammable substances present, and in order to attain flame retardancy of V-0 in the standard UL94, it is preferable to use 30 parts or more of inorganic hydrate for the inorganic filler. In addition, in the case of not using a phosphor-containing compound for the additive, it is preferable to use 100 parts or more thereof to improve tracking resistance. Moreover, the amount of inorganic filler added is preferably 260 parts or less in consideration of the target values of the resulting epoxy resin composition such as adhesion with metal foil, heat resistance, processability and insulation, as well as composite molding with a non-woven fabric or woven fabric base material and so forth.

(E) a condensed phosphate ester can be blended into the thermosetting resin composition of the present invention. The condensed phosphate ester has the structure represented by, for example, the following formula:

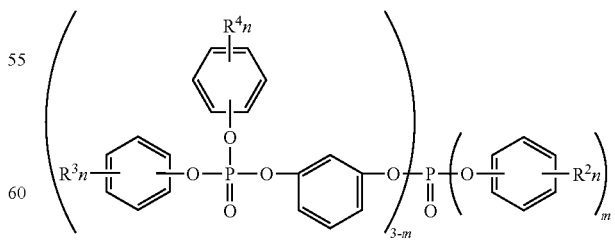

wherein $R^2$, $R^3$ and $R^4$ each represent an organic group including an alkyl group, a cycloalkyl group such as a cyclohexyl group, or an aromatic group such as a phenyl group (including a phenyl group that may be substituted by an alkyl group or alkoxy group), and each may be the same or different from each other, m is 1, 2 or 3, and n represents the number of the substituent $R^2$, $R^3$ or $R^4$, and each independently represents 0, 1 or 2 for $R^2$, $R^3$ or $R^4$.

The condensed phosphate esters have effects of overcoming the defects that high-temperature chemical resistance, humidity and heat resistance and Tg are significantly lowered by condensing a phosphate ester to have a high melting point.

Component (E) improves flame retardancy, and in consideration of both its effect of improving flame retardancy as well as humidity and heat resistance and Tg, it is preferably contained in an amount of 5 to 35 parts by weight, more preferably 5 to 30 parts by weight, even more preferably 5 to 20 parts by weight, and particularly preferably 10 to 20 parts by weight based on 100 parts by weight of the organic resin solid components of Components (A), (B) and (C).

The thermosetting resin composition of the present invention may also contain (F) epoxidized polybutadiene. (F) the epoxidized polybutadiene is preferably contained in an amount of 1 to 20 parts by weight, more preferably 1 to 15 parts by weight, and further preferably 1 to 10 parts by weight based on 100 parts by weight of the total amount of the organic solid components of said Components (A), (B) and (C).

The thermosetting resin composition of the present invention may contain (G) a copolymer component. (G) is a copolymer component having a crosslinked structure and a granular form having a mean particle diameter of 2 µm or less, and is preferably derived from at least one monomer selected from the group consisting of acrylonitrile, acrylic acid, ethyl acrylate, butyl acrylate, glycidyl acrylate, butadiene, ethyl methacrylate, butyl methacrylate and styrene. In consideration of the effect of improving punchability and inner layer peeling as well as both flame retardancy and Tg, Component (G) is preferably contained in an amount of 1 to 20 parts by weight, more preferably 1 to 15 parts by weight, further preferably 1 to 10 parts by weight, and particularly preferably 1 to 5 parts by weight based on 100 parts by weight of the total amount of the organic solid components of said Components (A), (B) and (C). This polymer may include those having a core shell structure in which a component having a different inside core portion is coated onto the surface layer portion, and the surface layer may be treated with a coupling agent or that in which a functional group has been introduced may be used. Component (G) is able to improve punchability and inner layer peeling.

In addition to these components, colorant, antioxidant, reducing agent, ultraviolet blocker and so forth may also be formulated as necessary.

The composition of the present invention is preferably used as a varnish in which the components have been dissolved or dispersed in an organic solvent. The organic solvent is not specifically limited, and a ketone type, an aromatic hydrocarbon type, an ester type, an amide type or an alcohol type organic solvent can be used. More specifically, examples of the ketone type solvents include acetone, methyl ethyl ketone, methyl isobutyl ketone and cyclohexanone, examples of the aromatic hydrocarbon type solvents include toluene and xylene, examples of the ester type solvents include methyoxyethyl acetate, ethoxyethyl acetate, butoxyethyl acetate and ethyl acetate, examples of the amide type solvents include N-methylpyrrolidone, formamide, N-methylformamide and N,N-dimethylacetamide, and examples of the alcohol type solvents include methanol, ethanol, ethylene glycol, ethylene glycol monomethyl ether, ethylene glycol monoethyl ether, diethylene glycol, triethylene glycol monomethyl ether, triethylene glycol monoethyl ether, triethylene glycol, propylene glycol monomethyl ether, dipropylene glycol monomethyl ether, propylene glycol monopropyl ether and dipropylene glycol monopropyl ether. These solvents may be used singly or in combination of two or more kinds as a mixture.

As the base material of woven fabric or non-woven fabric used in the prepreg of the present invention, there may be used natural fiber base materials such as paper or cotton linter; organic synthetic fiber base materials such as Aramid, polyvinyl alcohol, polyester or acrylic fiber, and inorganic fiber base materials such as glass and asbestos. A glass fiber base material is preferable from the viewpoint of flame resistance. Examples of the glass fiber base materials may include woven fabric using E glass, C glass, D glass or S glass, glass non-woven fabric in which short fibers are adhered with an organic binder, and further those in which glass fiber and cellulose fiber are mixed and made fabric.

According to the present invention, a prepreg can be produced by impregnating the above varnish into a base material such as a woven fabric or non-woven fabric followed by drying. The resulting prepreg may be laminated with a plurality of layers as necessary, and after composing a metal foil such as copper foil or aluminum foil on both surfaces, is subjected to pressurization and hot pressing to obtain a metal clad laminated board.

According to the present invention, a printed wiring board can be obtained by performing circuit processing on the metal foil of the metal foil clad laminated board. Circuit processing can be performed by, for example, forming a resist pattern on the surface of the metal foil, removing unnecessary portions of the foil by etching, removing the resist pattern, forming the required through holes by drilling, again forming the resist pattern, plating to connect the through holes, and finally removing the resist pattern. A multi-layer printed wiring board can be obtained by additionally laminating the above metal foil clad laminated board on the surface of the printed wiring board obtained in the above manner under the same conditions as described above, followed by performing circuit processing in the same manner as described above. In this case, it is not always necessary to form through holes, and via holes may be formed in their place, or both may be formed. These laminated boards are then laminated the required number of times.

The printed wiring board produced in the above manner can be laminated with metal foil provided with adhesive on one surface or both surfaces in the form of an inner layer circuit board. This lamination molding is normally performed under heating and pressurization. Examples of metal foil include copper foil and aluminum foil. A multi-layer printed circuit board can then be obtained by performing circuit processing in the same manner as described above on the resulting metal foil clad laminated board. The thermosetting resin composition of the present invention along with the printed circuit board material in which it is used are particularly useful in uses of high-frequency circuit boards of the MHz band or greater that take advantage of the low dielectric dissipation factor, or base boards for built-up that take advantage of the high modulus of elasticity.

EXAMPLES

In the following, the present invention is explained in detail by referring to Examples, but the present invention is not limited to these Examples. In the following explanation, part(s) refers to "part(s) by weight" and % refers to "% by weight" otherwise specifically mentioned.

Synthesis Example 1

(A-1) Synthesis of Thermosetting Resin Comprising a Dihydrobenzoxazine Ring as a Main Component To a 5 liter volume flask equipped with a thermometer, stirrer, condenser tube and dropping device were added 1000 g of bisphenol F and 920 g of methanol, and the mixture was dissolved at 50° C. while stirring. 652 g of paraformaldehyde were then added to the solution. Moreover, 930 g of aniline were added dropwise over one hour while stirring, and one hour later, the temperature was raised to 78 to 80° C. After allowing to react for 7 hours while refluxing, the pressure was reduced and the mixture was concentrated under reduced pressure at a pressure of 360 mmHg. Concentration was continued while maintaining this vacuum degree, and the vacuum degree was increased to 90 mmHg when the temperature of the resin reached 110° C. After confirming that there was no more outflow of liquid, the resin was taken out into a vat to produce a thermosetting resin (A1) comprising a dihydrobenzoxazine ring as a main component and having a softening point of the resin being 78° C.

Synthesis Example 2

(A-2) Synthesis of Thermosetting Resin Comprising a Dihydrobenzoxazine Ring as a Main Component The above thermosetting resin (A1) comprising a dihydrobenzoxazine ring as a main component was heated for 6 hours at 110° C. under normal pressure to produce a thermosetting resin (A2) comprising a dihydrobenzoxazine ring as a main component and having a softening point of the resin being 110° C.

Synthesis Example 3

(A-3 and 4) Synthesis of Thermosetting Resins Comprising a Dihydrobenzoxazine Ring as their Main Component (1) Synthesis of Phenol Novolak Into a 5 liter volume flask were charged 1.9 kg of phenol, 1.15 kg of formalin (37% aqueous solution) and 4 g of oxalic acid and the mixture was allowed to react for 6 hours at the reflux temperature. Subsequently, the inside of the flask was reduced to a pressure of 6666.1 Pa or lower to remove the unreacted phenol and water. The resulting resin had a softening point of 89° C. (the ring and ball method), and the ratio of {(3 core form+3 or more core form)/(2 core form)} was 89/11 (from peak area ratio as determined by gel permeation chromatography). The core form here refers to the phenol group portion.

(2) Introduction of Dihydrobenzoxazine Ring 1.7 kg of the phenol novolak resin synthesized as described above (equivalent to 16 mols of hydroxyl groups) were stirred for 5 hours at 80° C. with 1.49 kg (equivalent to 16 mols) of aniline to prepare a uniformly mixed solution. 1.62 kg of formalin were charged into a 5 liter volume flask and heated to 90° C. Next, the novolak/aniline mixed solution was then gradually added to the flask over 30 minutes. Two types of products were then prepared by holding at the reflux temperature for 30 minutes following completion of the addition or by holding at the reflux temperature for 90 minutes following completion of the addition. Thereafter, the pressure was reduced to 6666.1 Pa or lower for 2 hours at 100° C. to remove the condensed water and obtain two types of thermosetting resins in which 95% of the hydroxyl groups able to react were converted to dihydrobenzoxazine. Two types of the resins were thus obtained consisting of that in which the softening point that was held at the reflux temperature for 30 minutes after completion of the addition was 70° C. (A3), and that in which the softening point that was held to the reflux temperature for 90 minutes after completion of the addition was 105° C. (A4).

(B) Polycondensation Product of a Phenol, a Compound Having a Triazine Ring and an Aldehyde (B1) LA-7054 (trade name, Dainippon Ink and Chemicals), nitrogen content: 12%, OH equivalent: 127

(B2) LA-1356 (trade name, Dainippon Ink and Chemicals), nitrogen content: 19%, OH equivalent: 146

(C) Epoxy Resin (C1) Phenol novolak type epoxy resin

Epoxy equivalent: 170 to 180 g/eq., liquid at normal temperature (C2) Bisphenol F type epoxy resin Mw=2,000, epoxy equivalent: 950 to 1050 g/eq., solid at normal temperature (C3) Bisphenol F type epoxy resin Mw=340, epoxy equivalent: 160 to 180 g/eq., liquid at normal temperature (D) Inorganic Filler Aluminum hydroxide Mean particle diameter: 3 μm to 5 μm, purity: 99% or more (E) Condensed Phosphate Ester PX-200 (trade name, Daihachi Chemical)

(F) Epoxidized Butadiene

PB-3600 (trade name, Daicel Chemical Industries)

(G) Copolymer

Butadiene-alkyl methacrylate-styrene copolymer

EXL-2655, trade name, Kureha Chemical Industry Examples 1 to 17 and Comparative Examples 1 to 10

The resin compositions blended with solid components shown in Tables 1 to 4 were dissolved in methyl ethyl ketone followed by the addition of 0.3 part of the amount of the organic solid components of an anti-sedimentation agent of an inorganic filler (trade name: Aerozil 200, available from Nippon Aerozil) and 0.3 part of the amount of the organic solid components of a reducing agent (trade name: Yoshinox BB, available from Yoshitomi Pharmaceutical), and adjusting with methyl ethyl ketone so that the non-volatile components of the solution were 65 to 75% to obtain a varnish. Thereafter, the varnish was impregnated into a glass cloth (0.2 mm) and dried for 4 minutes at 160° C. to obtain a prepreg.

Next, 35 μm copper foil was laminated over both surfaces of a single prepreg, a laminate consisting of four layers of this prepreg, or a laminate consisting of eight layers of this prepreg, followed by hot press molding for 100 minutes at a temperature of 185° C. and a pressure of 4 MPa to produce both surfaces copper clad laminated boards having thicknesses of 0.2 mm (single prepreg layer), 0.8 mm (4 prepreg layers) and 1.6 mm (eight prepreg layers), respectively.

The prepregs prepared above and the both surfaces copper clad laminated boards prepared above were then arranged in the order of 18 μm copper foil/prepreg/single prepreg both surfaces copper clad laminated board (with copper remaining on all surfaces)/prepreg/18 μm copper foil, while the remainder of the procedure was performed in accordance with established methods for producing multi-layer wiring boards to produce a four-layer wiring board.

Moreover, a resin film with halogen-free copper foil (trade name: MCF-4000G, Hitachi Chemical Industries, Ltd.) was arranged on both sides of this four-layer wiring board to serve as a built-up layer followed by hot press molding for 100 minutes at a temperature of 185° C. and a pressure of 3 MPa to produce a six-layer wiring board having a built-up constitution.

The both surfaces copper clad laminated board prepared above (having 8 layers of prepreg) was investigated for dielectric dissipation factor, modulus of elasticity, amount of peeling during punching, flame retardancy (the both surfaces copper clad laminated board using 8 prepreg layers and the both surfaces copper clad laminated board using 4 prepreg layers were used for investigating flame retardancy), humidity and heat resistance, and Tg.

The results of characteristics relating to dielectric dissipation factor a, bending modulus of elasticity b, amount of warping of six-layer board c, burning resistance (flame retardancy) d, amount of peeling during punching e, drill breakage f, peel strength of the inner layer g, solder heat resistance h and glass transition temperature i are shown in Tables 5 to 8.

Incidentally, the methods for testing characteristics are as described below.

(a) Dielectric Dissipation Factor

Dielectric dissipation factor at 1 GHz was measured in accordance with IPC TM-650 2.5.5.5 by the resonance method using a strip line.

(b) Bending Modulus of Elasticity

Initial modulus of elasticity was measured during the bending test of JIS C 6481.

(c) Amount of Warping of Six-Layer Board

After removing all of the surface layer copper foil of a six-layer wiring board having a built-up constitution (a board with a size of 250×250 mm) by etching, the board was dried for 30 minutes at 150° C. on the assumption of the drying step of solder resist followed by measurement of the amount of warping. Warping is indicated in the table as the amount of warping of a six-layer board.

(d) Burning Resistance (Flame Retardancy): in Compliance with UL94
  (d1) 1.6 mm flame retardancy: Using a both surfaces copper clad laminated board having 8 prepreg layers
  (d2) 0.8 mm flame retardancy: Using a both surfaces copper clad laminated board having 4 prepreg layers (e) Amount of Peeling During Punching The both surfaces copper clad laminated board prepared was used as the sample after removing the copper foils by etching, and using a DIN mold, the amount of inner layer peeling (mm) during blank die processing was measured to determine the amount of peeling.

(f) Drill Breakage

Four four-layer wiring boards were superimposed on each other and 0.25 mm diameter holes were drilled under conditions of a rotating speed of 10 krpm and feeding speed of 2 m/min to test drill breakage up to a maximum of 3,000 holes. A ◎ indicates no breakage even at 3,000 holes or more, a ○ indicates breakage within 3,000 holes, a Δ indicates breakage within 2,000 holes, and an X indicates breakage within 30 holes.

(g) Peel Strength of Inner Layer

Peel strength of the inner layer (kN/m) was measured as the adhesion between the inner layer copper and prepreg layer using a four-layer wiring board.

(h) Solder Heat Resistance

The test piece (50 mm×50 mm, half coated with copper on one surface) following holding for 6 hours in a pressure cooker treatment apparatus at 121° C. and 2130 hPa was immersed in a solder bath heated to 260° C. for 30 seconds followed by observation of the occurrence of blistering (h1) and measling (h2) with naked eyes. In the table, the symbol ○ indicates no change, Δ indicates the occurrence of measling or lifting, and X indicates the occurrence of blistering.

(i) Glass Transition Temperature (Tg)

Tg was measured according to the TMA method defined in JIS-C-6481. Incidentally, the sample was heated to equal to or above the glass transition temperature at a heating rate of 10° C./min, and after temporarily cooling to room temperature, the sample was again heated at the heating rate of 10° C./min followed by measurement of the amount of dimensional change, after which the glass transition temperature (° C.) was determined from a "Temperature vs. Dimensions" curve.

TABLE 1

Formulation of Composition (1) (parts by weight)

|    | Example 1 | Example 2 | Example 3 | Example 4 | Example 5 | Example 6 | Example 7 |
|----|-----------|-----------|-----------|-----------|-----------|-----------|-----------|
| A1 | 43 | 43 | 43 | 0  | 0  | 0  | 0  |
| A2 | 0  | 0  | 0  | 43 | 43 | 0  | 0  |
| A3 | 0  | 0  | 0  | 0  | 0  | 68 | 0  |
| A4 | 0  | 0  | 0  | 0  | 0  | 0  | 68 |
| B1 | 0  | 0  | 0  | 0  | 0  | 16 | 16 |
| B2 | 21 | 21 | 21 | 21 | 21 | 0  | 0  |
| C1 | 36 | 36 | 36 | 36 | 36 | 16 | 16 |
| C2 | 0  | 0  | 0  | 0  | 0  | 0  | 0  |
| C3 | 0  | 0  | 0  | 0  | 0  | 0  | 0  |
| D  | 63 | 63 | 63 | 63 | 63 | 82 | 82 |
| E  | 17 | 17 | 17 | 17 | 0  | 12 | 12 |
| F  | 4  | 4  | 0  | 0  | 0  | 4  | 4  |
| G  | 4  | 0  | 0  | 0  | 0  | 0  | 0  |

Note:
In the table, the basis for the parts by weight is a total amount, 100 parts by weight, of the organic solid components of Components (A), (B) and (C).

TABLE 2

Formulation of Composition (2) (parts by weight)

|    | Example 8 | Example 9 | Example 10 | Example 11 | Example 12 | Example 13 | Example 14 |
|----|-----------|-----------|------------|------------|------------|------------|------------|
| A1 | 43 | 43 | 43 | 0  | 0  | 0    | 0    |
| A2 | 0  | 0  | 0  | 43 | 43 | 0    | 0    |
| A3 | 0  | 0  | 0  | 0  | 0  | 41   | 41   |
| A4 | 0  | 0  | 0  | 0  | 0  | 0    | 0    |
| B1 | 0  | 0  | 0  | 0  | 0  | 0    | 0    |
| B2 | 21 | 21 | 21 | 21 | 21 | 18   | 18   |
| C1 | 36 | 36 | 36 | 36 | 36 | 25.5 | 25.5 |
| C2 | 0  | 0  | 0  | 0  | 0  | 15.5 | 15.5 |
| C3 | 0  | 0  | 0  | 0  | 0  | 0    | 0    |
| D  | 63 | 63 | 63 | 260| 0  | 62   | 62   |
| E  | 17 | 17 | 27 | 0  | 0  | 17   | 17   |
| F  | 4  | 12 | 0  | 0  | 0  | 4    | 0    |
| G  | 12 | 0  | 0  | 0  | 0  | 0    | 0    |

Note:
In the table, the basis for the parts by weight is a total amount, 100 parts by weight, of the organic solid components of Components (A), (B) and (C).

TABLE 3

Formulation of Composition (3) (parts by weight)

|    | Example 15 | Example 16 | Example 17 | Example 18 | Example 19 | Example 20 | Example 21 |
|----|------------|------------|------------|------------|------------|------------|------------|
| A1 | 0    | 0  | 0  | 0    | 0  | 0  | 0  |
| A2 | 0    | 0  | 0  | 0    | 0  | 0  | 0  |
| A3 | 0    | 41 | 68 | 41   | 68 | 41 | 41 |
| A4 | 41   | 0  | 0  | 0    | 0  | 0  | 0  |
| B1 | 0    | 0  | 16 | 0    | 0  | 0  | 0  |
| B2 | 18   | 18 | 0  | 18   | 16 | 18 | 18 |
| C1 | 25.5 | 36 | 3  | 25.5 | 3  | 39 | 16 |
| C2 | 15.5 | 5  | 13 | 0    | 0  | 2  | 25 |

TABLE 3-continued

Formulation of Composition (3) (parts by weight)

|    | Example 15 | Example 16 | Example 17 | Example 18 | Example 19 | Example 20 | Example 21 |
|----|------------|------------|------------|------------|------------|------------|------------|
| C3 | 0          | 0          | 0          | 15.5       | 13         | 0          | 0          |
| D  | 62         | 82         | 82         | 62         | 82         | 62         | 62         |
| E  | 17         | 17         | 12         | 17         | 12         | 17         | 17         |
| F  | 0          | 4          | 4          | 4          | 4          | 4          | 4          |
| G  | 0          | 0          | 0          | 0          | 0          | 0          | 0          |

Note:
In the table, the basis for the parts by weight is a total amount, 100 parts by weight, of the organic solid components of Components (A), (B) and (C).

TABLE 4

Formulation of Composition (4) (parts by weight)

|    | Comparative example 1 | Comparative example 2 | Comparative example 3 | Comparative example 4 | Comparative example 5 | Comparative example 6 |
|----|----|----|----|----|----|----|
| A1 | 0  | 0  | 0  | 0  | 0  | 0  |
| A2 | 23 | 47 | 78 | 0  | 0  | 0  |
| A3 | 0  | 0  | 0  | 23 | 36 | 78 |
| A4 | 0  | 0  | 0  | 0  | 0  | 0  |
| B1 | 16 | 15 | 16 | 16 | 16 | 16 |
| B2 | 0  | 0  | 0  | 0  | 0  | 0  |
| C1 | 61 | 48 | 6  | 48 | 35 | 1  |
| C2 | 0  | 0  | 0  | 13 | 13 | 5  |
| C3 | 0  | 0  | 0  | 0  | 0  | 0  |
| D  | 82 | 82 | 82 | 82 | 82 | 82 |
| E  | 12 | 12 | 12 | 12 | 12 | 12 |
| F  | 4  | 4  | 4  | 4  | 4  | 4  |
| G  | 0  | 0  | 0  | 0  | 0  | 0  |

Note:
In the table, the basis for the parts by weight is a total amount, 100 parts by weight, of the organic solid components of Components (A), (B) and (C).

TABLE 5

Characteristics evaluation (1)

| Characteristics | Example 1 | Example 2 | Example 3 | Example 4 | Example 5 | Example 6 | Example 7 |
|---|---|---|---|---|---|---|---|
| Dielectric tangent (1 GHz) | 0.011 | 0.01 | 0.01 | 0.01 | 0.01 | 0.01 | 0.01 |
| Bending elasticity | 31 | 31 | 31 | 31 | 31 | 32 | 32 |
| Amount of warping of six-layer board | 0.3 | 0.3 | 0.3 | 0.3 | 0.3 | 0.2 | 0.2 |
| Flame retardancy (1.6 mm) | V – 0 | V – 0 | V – 0 | V – 0 | V – 0 | V – 0 | V – 0 |
| Flame retardancy (0.8 mm) | V – 0 | V – 0 | V – 0 | V – 0 | V – 1 | V – 0 | V – 0 |
| Amount of peeling during punching | 0.7 | 1 | 1.2 | 1.5 | 1.3 | 1.5 | 3 |
| Drill breakage | ◎ | ◎ | ◎ | ○ | ○ | ○ | ○ |
| Inner layer peeling strength | 0.75 | 0.55 | 0.55 | 0.5 | 0.6 | 0.5 | 0.4 |
| Solder heat resistance (blister) | ○ | ○ | ○ | ○ | ○ | ○ | ○ |
| Solder heat resistance (Measling) | ○ | ○ | ○ | ○ | ○ | ○ | ○ |
| Tg (° C.) | 145 | 147 | 148 | 148 | 152 | 148 | 148 |

TABLE 6

Characteristics evaluation (2)

| Characteristics | Example 8 | Example 9 | Example 10 | Example 11 | Example 12 | Example 13 | Example 14 |
|---|---|---|---|---|---|---|---|
| Dielectric tangent (1 GHz) | 0.014 | 0.013 | 0.011 | 0.008 | 0.014 | 0.0070 | 0.0071 |
| Bending elasticity | 28 | 27 | 27 | 34 | 28 | 27 | 28 |

TABLE 6-continued

Characteristics evaluation (2)

| Characteristics | Example 8 | Example 9 | Example 10 | Example 11 | Example 12 | Example 13 | Example 14 |
|---|---|---|---|---|---|---|---|
| Amount of warping of six-layer board | 0.4 | 0.5 | 0.4 | 0.5 | 0.4 | 0.5 | 0.4 |
| Flame retardancy (1.6 mm) | V – 0 | V – 0 | V – 0 | V – 0 | V – 0 | V – 0 | V – 0 |
| Flame retardancy (0.8 mm) | burning | burning | V – 0 | V – 0 | V – 1 | V – 0 | V – 0 |
| Amount of peeling during punching | 0.6 | 0.9 | 1.3 | 3.2 | 0.9 | 0.8 | 1.0 |
| Drill breakage | ◉ | ◉ | ◉ | ○ | ◉ | ◉ | ◉ |
| Inner layer peeling strength | 0.72 | 0.53 | 0.51 | 0.22 | 0.52 | 0.75 | 0.55 |
| Solder heat resistance (blister) | ○ | ○ | ○ | X | ○ | ○ | ○ |
| Solder heat resistance (Measling) | X | X | X | X | ○ | ○ | ○ |
| Tg (° C.) | 110 | 115 | 105 | 155 | 155 | 142 | 147 |

TABLE 7

Characteristics evaluation (3)

| Characteristics | Example 15 | Example 16 | Example 17 | Example 18 | Example 19 | Example 20 | Example 21 |
|---|---|---|---|---|---|---|---|
| Dielectric tangent (1 GHz) | 0.0070 | 0.0070 | 0.0060 | 0.0070 | 0.0060 | 0.0070 | 0.0071 |
| Bending elasticity | 28 | 29 | 31 | 27 | 31 | 28 | 26.5 |
| Amount of warping of six-layer board | 0.4 | 0.3 | 0.3 | 0.5 | 0.3 | 0.4 | 1.0 |
| Flame retardancy (1.6 mm) | V – 0 | V – 0 | V – 0 | V – 0 | V – 0 | V – 0 | V – 0 |
| Flame retardancy (0.8 mm) | V – 0 | V – 0 | V – 0 | V – 0 | V – 0 | V – 0 | V – 0 |
| Amount of peeling during punching | 1.3 | 1.0 | 1.0 | 1.2 | 1.5 | 1.4 | 0.7 |
| Drill breakage | ◉ | Δ | X | ◉ | Δ | ◉ | ◉ |
| Inner layer peeling strength | 0.50 | 0.70 | 0.50 | 0.60 | 0.50 | 0.55 | 0.78 |
| Solder heat resistance (blister) | ○ | ○ | ○ | ○ | ○ | ○ | ○ |
| Solder heat resistance (Measling) | ○ | ○ | ○ | ○ | ○ | ○ | ○ |
| Tg (° C.) | 148 | 144 | 144 | 144 | 148 | 144 | 118 |

TABLE 8

Characteristics evaluation (4)

| Characteristics | Comparative example 1 | Comparative example 2 | Comparative example 3 | Comparative example 4 | Comparative example 5 | Comparative example 6 |
|---|---|---|---|---|---|---|
| Dielectric tangent (1 GHz) | 0.022 | 0.019 | 0.008 | 0.0120 | 0.0110 | 0.0060 |
| Bending elasticity | 25 | 26 | 34 | 24 | 25 | 34 |
| Amount of warping of six-layer board | 1.5 | 1.2 | 0.2 | 1.7 | 1.5 | 0.2 |
| Flame retardancy (1.6 mm) | V – 1 | V – 0 | V – 0 | V – 1 | V – 0 | V – 0 |
| Flame retardancy (0.8 mm) | V – 1 | V – 1 | V – 0 | V – 1 | V – 1 | V – 0 |
| Amount of peeling during punching | 1 | 1.2 | 3 | 0.7 | 1.0 | 2.8 |
| Drill breakage | ◉ | ◉ | ○ | ◉ | ◉ | ◉ |
| Inner layer peeling strength | 0.65 | 0.6 | 0.1 | 0.75 | 0.65 | 0.10 |
| Solder heat resistance (blister) | ○ | ○ | ○ | ○ | ○ | ○ |
| Solder heat resistance (Measling) | X | ○ | ○ | ○ | ○ | ○ |
| Tg (° C.) | 118 | 122 | 155 | 115 | 119 | 148 |

On the basis of the above results, it was able to be confirmed that the present invention is able to achieve low dielectric dissipation factor and high modulus of elasticity, little warping during a built-up composition, high heat resistance and high Tg, while at the same time being able to inhibit inner layer peeling that occurs during blank die processing, achieve superior small diameter drill breakage, and a level of flame retardancy of V-0 in the standard UL94 at a content of halogen and antimony compound being 0.25% by weight or less. In addition, the halogen content was 0.0.2% by weight or less with a bromine ion, and 0.01% by weight or less with a chlorine ion.

UTILIZABILITY IN INDUSTRY

According to the present invention, a thermosetting resin composition having superior balance between characteristics such as low dielectric dissipation factor, high modulus of elasticity, high heat resistance, low moisture absorption, high Tg and flame retardancy, and processability, along with a prepreg, laminated board for a wiring board, printed wiring board, molding material and adhesive composition in which it is used, are able to be obtained.

Moreover, by adding inorganic filler or condensed phosphate ester as additives having the effect of enhancing flame retardancy to the composition of the present invention, it becomes possible to obtain synergistic effects as compared with the case of using each flame retardant alone due to the combined use of these flame retardants having different flame retarding action and working temperature ranges, thereby making it possible to obtain a thermosetting resin composition having superior balance among stability, flame retardancy and other characteristics.

In addition, according to the present invention, a laminated board for a printed wiring board and a printed wiring board material can be obtained which, simultaneous to having little warping, high heat resistance and high Tg during a built-up composition with low dielectric dissipation factor and high modulus of elasticity, has superior blank die processability and drilling, peel strength of the inner layer, which indicates adhesive strength with the resin layer in contact with the inner layer circuit of a multi-layer wiring board, is improved, the content of halogen and antimony compounds is 0.25% by weight or less, and a level of flame retardancy of V-0 in standard UL94 can be achieved.

What is claimed is:

1. A thermosetting resin composition which comprises:
   (A) 35 to 75 parts by weight of a thermosetting resin comprising a compound having a dihydrobenzoxazine ring as a main component;
   (B) 10 to 25 parts by weight of a polycondensation product of a phenol, a compound having a triazine ring and an aldehyde; and
   (C) 10 to 45 parts by weight of an epoxy resin, based on 100 parts by weight of a total amount of organic solid components of Components (A), (B) and (C); wherein at least a part of the epoxy resin comprises
   (i) a bisphenol F epoxy resin having a weight average molecular weight of 1,000 to 3,000, or
   (ii) a mixed epoxy resin of bisphenol F epoxy resin and bisphenol A epoxy resin having a weight average molecular weight of 1,000 to 3,000.

2. The composition according to claim 1, wherein the composition further contains 5 to 300 parts by weight of (D) an inorganic filler based on 100 parts by weight of the total amount of the organic solid components of Components (A), (B) and (C).

3. The composition according to claim 1, wherein the composition further contains 5 to 35 parts by weight of (E) condensed phosphate ester based on 100 parts by weight of the total amount of the organic solid components of Components (A), (B) and (C).

4. The composition according to claim 1, wherein Component (A) has a softening point of 110° C. or lower.

5. The composition according to claim 1, wherein the composition further contains 1 to 20 parts by weight of (F) epoxidized polybutadiene based on 100 parts by weight of the total amount of the organic solid components of Components (A), (B) and (C).

6. The composition according to claim 1, wherein the composition further contains (G) a copolymer component which is a crosslinking copolymer having a crosslinked structure and a granular form having a mean particle diameter of 2 μm or less derived from at least one monomer selected from the group consisting of acrylonitrile, acrylic acid, ethyl acrylate, butyl acrylate, glycidyl acrylate, butadiene, alkyl methacrylate and styrene, in an amount of 1 to 10 parts by weight of Component (G) based on 100 parts by weight of the total amount of the organic solid components of Components (A), (B) and (C).

7. The composition according to claim 1, wherein the content of each halogen element in the composition is 0.25% by weight or less.

8. A prepreg using the composition according to claim 1.

9. The prepreg according to claim 8, wherein a prepreg base material is a woven fabric or non-woven fabric.

10. A laminated board for a printed wiring board obtained by laminating metal foil on one surface or both surfaces of the prepreg according to claim 8 followed by hot press forming.

11. A printed wiring board using the laminated board according to claim 10 for a wiring board.

12. A printed wiring board using different types or similar types of the prepreg according to claim 8.

13. A laminated board for a printed wiring board according to claim 10, using different types or similar types of said prepreg.

14. A printed wiring board according to claim 11, using different types or similar types of said prepreg.

15. The composition according to claim 2, wherein the composition further contains 5 to 35 parts by weight of (E) condensed phosphate ester based on 100 parts by weight of the total amount of the organic solid components of Components (A), (B) and (C).

16. The composition according to claim 3, wherein Component (A) has a softening point of 110° C. or lower.

17. The composition according to claim 4, wherein the composition further contains 1 to 20 parts by weight of (F) epoxidized polybutadiene based on 100 parts by weight of the total amount of the organic solid components of Components (A), (B) and (C).

18. The composition according to claim 5, wherein the composition further contains (G) a copolymer component which is a crosslinking copolymer having a crosslinked structure and a granular form having a mean particle diameter of 2 μm or less derived from at least one monomer selected from the group consisting of acrylonitrile, acrylic acid, ethyl acrylate, butyl acrylate, glycidyl acrylate, butadiene, alkyl methacrylate and styrene, in an amount of 1 to 10 parts by weight of Component (G) based on 100 parts by weight of the total amount of the organic solid components of Components (A), (B) and (C).

19. The composition according to claim 6, wherein the content of each halogen element in the composition is 0.25% by weight or less.

20. A prepreg using the composition according to claim 7.

21. The composition according to claim 1, wherein said Component (i) a bisphenol F epoxy resin or said Component (ii) a mixed epoxy resin of bisphenol F epoxy resin and bisphenol A epoxy resin is contained in Component (C) in an amount of 4 to 100% by weight, of Component (C).

22. The composition according to claim 21, wherein said Component (i) or said Component (ii) has a weight average molecular weight (Mw) of 1,500 to 2,500.

23. The composition according to claim 1, wherein said Component (i) or said Component (ii) has a weight average molecular weight (Mw) of 1,500 to 2,500.

24. The composition according to claim 1, wherein said Component (i) a bisphenol F epoxy resin is contained in Component (C).

25. The composition according to claim 1, wherein said Component (ii) a mixed epoxy resin of bisphenol F epoxy resin and bisphenol A epoxy resin is contained in Component (C).

26. The composition according to claim 1, wherein said Component (i) a bisphenol F epoxy resin or said Component (ii) a mixed epoxy resin of bisphenol F epoxy resin and bisphenol A epoxy resin is contained in Component (C) in an amount of 4 to 60% by weight, of Component (C).

* * * * *